(12) United States Patent
Kim

(10) Patent No.: US 11,232,725 B2
(45) Date of Patent: Jan. 25, 2022

(54) DISPLAY DEVICE AND METHOD OF INSPECTING DISPLAY DEVICE

(71) Applicant: Samsung Display Co., Ltd., Yongin-si (KR)

(72) Inventor: Kee Yong Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 363 days.

(21) Appl. No.: 16/225,345

(22) Filed: Dec. 19, 2018

(65) Prior Publication Data
US 2019/0197931 A1   Jun. 27, 2019

(30) Foreign Application Priority Data

Dec. 27, 2017 (KR) .......................... 10-2017-0181078

(51) Int. Cl.
| | | |
|---|---|---|
| G09G 3/00 | (2006.01) | |
| G01R 31/317 | (2006.01) | |
| G06F 11/27 | (2006.01) | |
| G06F 11/32 | (2006.01) | |

(52) U.S. Cl.
CPC ....... *G09G 3/006* (2013.01); *G01R 31/31701* (2013.01); *G06F 11/27* (2013.01); *G06F 11/321* (2013.01); *G09G 2330/12* (2013.01)

(58) Field of Classification Search
CPC .............. G09G 3/006; G09G 2330/12; G01R 31/31701; G06F 11/27; G06F 11/321
USPC ...................................................... 714/733
See application file for complete search history.

(56) References Cited

U.S. PATENT DOCUMENTS

| | | | | |
|---|---|---|---|---|
| 5,390,191 | A  * | 2/1995 | Shiono | ........... G01R 31/318558 714/727 |
| 5,657,330 | A | 8/1997 | Matsumoto | |
| 7,353,443 | B2 * | 4/2008 | Sharma | ............... G06F 11/0745 714/712 |
| 8,607,103 | B2 * | 12/2013 | Owaki | .................. G06F 11/277 714/715 |

(Continued)

FOREIGN PATENT DOCUMENTS

| | | |
|---|---|---|
| KR | 10-0227019 B1 | 10/1999 |
| KR | 10-1471391 B1 | 12/2014 |

(Continued)

*Primary Examiner* — James C Kerveros
(74) *Attorney, Agent, or Firm* — Lewis Roca Rothgerber Christie LLP

(57) ABSTRACT

A display device includes a panel unit including a display unit, a first circuit board connected to the display unit, and a first connecting member connected to the first circuit board, an input unit including a connection member configured to attach to the first connecting member, and to provide an image signal to the panel unit, a master configured to output a transmitting signal for diagnosing an electrical connection between the first connecting member and the connection member, a transmitting line connected to the master, an inspecting line configured to connect to the transmitting line through the connection member, and a slave configured to connect to the master through the inspecting line, to receive the transmitting signal as a receiving signal, and to enable determination of on-time duty and off-time duty of the receiving signal to determine whether a connection error between the panel unit and the input unit exists.

20 Claims, 14 Drawing Sheets

(56) References Cited

U.S. PATENT DOCUMENTS

| | | | | |
|---|---|---|---|---|
| 2004/0128603 A1* | 7/2004 | Reberga | ............ | H04L 1/242 |
| | | | | 714/738 |
| 2007/0157058 A1* | 7/2007 | Park | ............ | G01R 31/31725 |
| | | | | 714/727 |
| 2007/0182440 A1* | 8/2007 | Cha | ............ | G09G 3/3611 |
| | | | | 324/760.01 |
| 2014/0266244 A1* | 9/2014 | Minaev | ............ | G09G 3/006 |
| | | | | 324/537 |

FOREIGN PATENT DOCUMENTS

| KR | 10-2015-0042573 A | 4/2015 |
|---|---|---|
| KR | 10-1747343 B1 | 6/2017 |
| KR | 10-1756586 B1 | 7/2017 |
| KR | 10-1764681 B1 | 8/2017 |

* cited by examiner

DISPLAY DEVICE AND METHOD OF INSPECTING DISPLAY DEVICE

CROSS-REFERENCE TO RELATED APPLICATION

This application claims priority to, and the benefit of, Korean Patent Application No. 10-2017-0181078 filed in the Korean Intellectual Property Office on Dec. 27, 2017, the entire contents of which are incorporated herein by reference.

BACKGROUND

1. Field

Embodiments of the present invention relate to a display device, and a method of inspecting a display device having a self-diagnosis function.

2. Description of the Related Art

A display device is formed of a display panel, and an assembly of a plurality of parts for driving the display panel. The display panel may be manufactured through a process of forming a plurality of pixels, several wires, and a thin film transistor on a substrate. An inspecting process of connecting inspecting equipment, which is for driving the display panel, to the display panel manufactured through this process, and of confirming whether an error corresponding to a screen of the display panel exists, is performed.

When a contact error is generated in the process of connecting the display panel and the inspecting equipment, a case in which the screen of the display panel does not display an image normally may occur, and the corresponding display panel may be determined to be defective in this case. That is, a case in which a non-defective display panel is erroneously determined to be defective may occur due to the contact error between the display panel and the inspecting equipment, which is not an intrinsic defect of the display panel due to a defect of the wiring or the thin film transistor of the display panel. This may reduce production yield of the display panel. When not distinguishing between the intrinsic defect and the contact error of the display panel, it is difficult to accurately detect the defect cause of the display panel, and it is difficult to prepare improvement measures for preventing display panel defects.

The above information disclosed in this Background section is only for enhancement of understanding of the background of the invention and therefore it may contain information that does not form the prior art that is already known in this country to a person of ordinary skill in the art.

SUMMARY

Embodiments of the present invention provide a display device, and an inspecting method of a display device for self-diagnosing a contact error between a panel unit and an inspecting unit, and for self-diagnosing a connection failure between a panel unit and an input unit.

A display device according to an embodiment of the present invention includes a panel unit including a display unit, a first circuit board connected to the display unit, and a first connecting member connected to the first circuit board, an input unit including a connection member configured to be attached to the first connecting member, and to provide an image signal to the panel unit, a master configured to output a transmitting signal for diagnosing an electrical connection between the first connecting member and the connection member, a transmitting line connected to the master, an inspecting line configured to be connected to the transmitting line through the connection member, and a slave configured to be connected to the master through the inspecting line, to receive the transmitting signal as a receiving signal, and to enable determination of an on-time duty and an off-time duty of the receiving signal to determine whether a connection error between the panel unit and the input unit exists.

The input unit may further include a second connecting member connected to the connection member, a second circuit board connected to the second connecting member, and a signal controller at the second circuit board, and including the master and the slave.

The display device may further include a receiving line connected to the slave, and extending along the second connecting member to be connected to the connection member, wherein the transmitting line extends along the second connecting member to be connected to the connection member, and wherein the inspecting line is at the first connecting member and includes one terminal configured to be in contact with the transmitting line through the connection member, and another terminal configured to be in contact with the receiving line through the connection member.

The input unit may further include a third connecting member connected to the connection member, and an image signal generator connected to the third connecting member, and the panel unit may further include a signal controller including the master and the slave at the first circuit board.

The display device may further include a receiving line connected to the slave, and extending along the first connecting member, wherein the transmitting line extends along the first connecting member, and wherein the inspecting line is at the third connecting member and includes one terminal configured to contact the transmitting line through the connection member, and another terminal configured to contact the receiving line through the connection member.

The input unit may further include a third connecting member connected to the connection member, and an image signal generator including the master and the slave and connected to the third connecting member, and the panel unit may further include a signal controller at the first circuit board.

The display device may further include a receiving line connected to the slave, and extending along the third connecting member to be connected to the connection member, wherein the transmitting line extends along the third connecting member to be connected to the connection member, and wherein the inspecting line includes a first inspecting line configured to be in contact with the transmitting line through the connection member, and a second inspecting line configured to be in contact with the receiving line through the connection member.

The signal controller may be connected to the first inspecting line and the second inspecting line, and includes a switching unit for electrically connecting the first inspecting line and the second inspecting line.

The switching unit may include a first switch for electrically connecting the first inspecting line and the second inspecting line, a second switch for connecting the first inspecting line to an input terminal of the signal controller, and a third switch for connecting the second inspecting line to the input terminal of the signal controller.

The first switch may be configured to be turned on during a connection diagnosis period for executing a connection diagnosis between the panel unit and the input unit, and the second switch and the third switch may be configured to be turned on during a normal driving period for displaying an image on the display unit.

The input unit may further include a third connecting member connected to the connection member, and an image signal generator including the master, and connected to the third connecting member, and the panel unit may further include a signal controller including the slave at the first circuit board.

The signal controller may further include a switching unit for electrically connecting the inspecting line to the slave, wherein the transmitting line extends along the third connecting member to be connected to the connection member, and the inspecting line may extend along the first connecting member to be connected to the switching unit.

The switching unit may include a first switch for electrically connecting the inspecting line and the slave, and a second switch for connecting the inspecting line to an input terminal of the signal controller.

The first switch may be configured to be turned on during a connection diagnosis period for executing a connection diagnosis between the panel unit and the input unit, and the second switch may be configured to be turned on during a normal driving period for displaying an image on the display unit.

The master may be configured to divide the transmitting signal into a plurality of periods, and to transmit the divided transmitting signal, which is output with a waveform of cycles that are different from each other for each of the plurality of periods.

An inspecting method of a display device according to another embodiment of the present invention includes connecting a panel unit, which includes a display unit, a first circuit board connected to the display unit, and a first connecting member connected to the first circuit board, and an inspecting unit, which includes a connection member configured to be attached to the first connecting member, applying a transmitting signal for enabling contact diagnosis between the first connecting member and the connection member to a transmitting line, receiving the transmitting signal as a receiving signal through an inspecting line connected to the transmitting line through the connection member, and determining an on-time duty and an off-time duty of the receiving signal to determine a contact error between the panel unit and the inspecting unit.

The applying of the transmitting signal to the transmitting line may include outputting a transmitting signal of a first waveform during a first period, and outputting a transmitting signal of a second waveform during a second period that is shorter than the first period.

A cycle of the transmitting signal of the second waveform may be shorter than a cycle of the transmitting signal of the first waveform.

The inspecting method may further include displaying an image on the display unit indicating a contact normality when a contact between the panel unit and the inspecting unit is normal.

The inspecting method may further include displaying an image on the display unit indicating a contact error when a contact between the panel unit and the inspecting unit is defective.

Accordingly, the contact error between the panel unit and the inspecting unit may be self-diagnosed, and a production yield of the display panel may be improved.

Also, the connection error between the panel unit of the produced display device and the input unit may be self-diagnosed, and accordingly the failure of the display device may be confirmed.

DETAILED DESCRIPTION

Figure 1:
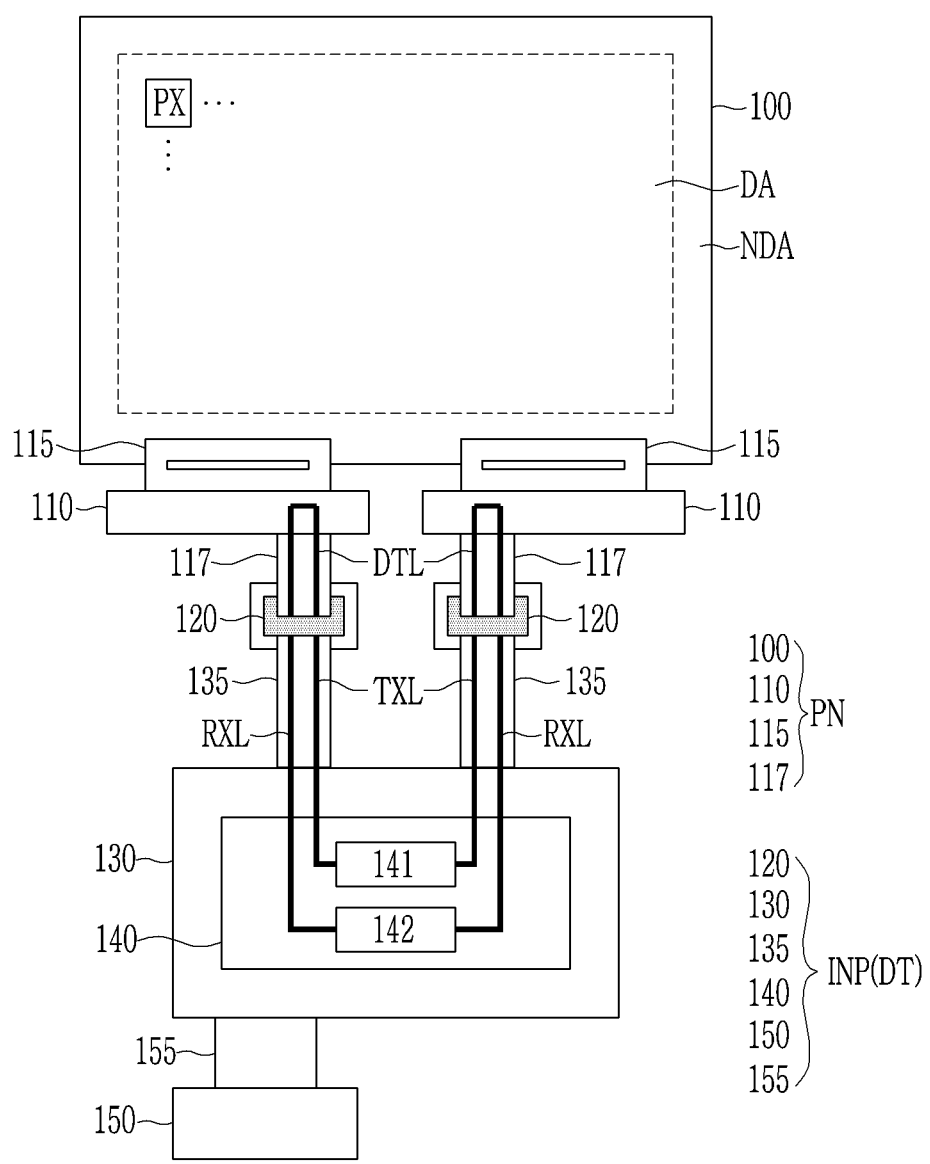
FIG. 1 is a block diagram showing a display device according to an embodiment of the present invention.

Embodiments of the present invention will be described more fully hereinafter with reference to the accompanying drawings, in which embodiments of the invention are shown. As those skilled in the art would realize, the described embodiments may be modified in various different ways, all without departing from the spirit or scope of the present invention.

To clarify the present invention, parts that are not connected with the description will be omitted, and the same or equivalent elements are referred to by the same reference numerals throughout the specification.

In the drawings, the size and thickness of each element is approximately shown for better understanding and ease of description. Therefore, the present invention is not limited to the drawings. In the drawings, the thickness of layers, films, panels, regions, etc., are exaggerated for clarity. Further, in the drawings, the thickness of layers and regions are partially exaggerated for better understanding and ease of description.

In addition, unless explicitly described to the contrary, the word "comprise" and variations such as "comprises" or "comprising" will be understood to imply the inclusion of stated elements, but not the exclusion of any other elements.

Now, a display device according to an embodiment of the present invention will be described with reference to FIG. 1, and then a method of performing an inspection of a panel unit in a manufacturing process of the display device will be described with reference to FIG. 2 to FIG. 5.

FIG. 1 is a block diagram showing a display device according to an embodiment of the present invention.

Referring to FIG. 1, a display device includes a panel unit PN and an input unit INP.

The panel unit PN may include a display unit 100, a first circuit board 110, a data driver 115, and a first connecting member 117. The input unit INP may include a connection member 120, a second circuit board 130, a second connecting member 135, a signal controller 140, an image signal generator 150, and a third connecting member 155.

The display unit 100 includes a display area DA and a non-display area NDA, a plurality of pixels PX may be located in the display area DA, and a plurality of signal lines for driving the plurality of pixels PX may be located in the non-display area NDA.

The first circuit board 110 may include a printed circuit, printed wiring, etc. Also, the first circuit board 110 may include a mechanical part, etc., electrically connected to the printed circuit or the printed wiring. The mechanical part may include a chip, a memory, etc. for the driving of the display unit 100.

The data driver 115 is connected between the display unit 100 and the first circuit board 110. The data driver 115 may be mounted as a chip-on-film (COF) type on a flexible printed circuit film. The display unit 100 and the first circuit board 110 may be electrically connected through the flexible printed circuit film. The data driver 115 may generate a data voltage to be applied to the plurality of pixels PX.

The first connecting member 117 may include a cable in which a plurality of wires for electrically connecting the first circuit board 110 to the second circuit board 130 are formed. The plurality of wires included in the first connecting member 117 may be connected to the printed circuit or the printed wiring of the first circuit board 110. The first connecting member 117 may include a flexible flat cable (FFC). The first connecting member 117 may have one terminal connected to the first circuit board 110, and another terminal extending from the first circuit board 110 in one direction. For example, the first connecting member 117 may be connected to a different part from a part to which the data driver 115 is connected in the first circuit board 110, and the first connecting member 117 may extend in a different direction from the extending direction of the data driver 115 (e.g., in a different direction than the direction in which the data driver 115 extends).

An assembly in which the first circuit board 110, the data driver 115, and the first connecting member 117 are assembled is referred to as a first printed board assembly (PBA). In FIG. 1, the first printed board assembly includes two first circuit boards 110, two data driver 115, and two first connecting members 117, although the numbers of the first circuit boards 110, the data drivers 115, and the first connecting members 117 are not limited thereto.

The second circuit board 130 may include the printed circuit, the printed wiring, etc. Also, the second circuit board 130 may include the mechanical parts electrically connected to the printed circuit or the printed wiring. The mechanical part may include the chip, the memory, etc. for driving the display unit 100.

The second connecting member 135 may be connected between the second circuit board 130 and the connection member 120, and may include the plurality of wires to electrically connect the first circuit board 110 and the second circuit board 130. One terminal of the second connecting member 135 may be connected to the second circuit board 130, and the other terminal thereof may be connected to the connection member 120. One terminal of the plurality of wires included in the second connecting member 135 may be connected to the printed circuit or the printed wiring of the second circuit board 130, and the other terminal thereof may be connected to the connection member 120. The second connecting member 135 may include the flexible printed circuit (FPC).

The connection member 120 may be connected to the other terminal of the second connecting member 135, and the first connecting member 117 may be provided to be attachable and detachable. The first connecting member 117 and the second connecting member 135 may be in contact (e.g., with the connection member 120) to be electrically connected through the connection member 120. The plurality of wires of the first connecting member 117 and the plurality of wires of the second connecting member 135 may be in contact to be connected through the connection member 120. That is, the connection member 120 may have a function of electrically connecting the panel unit PN and the input unit INP. The connection member 120 may include a connector electrically connecting the first connecting member 117 and the second connecting member 135.

The signal controller 140 receives the image signal input from the image signal generator 150 and the input control signal for controlling the display thereof, and processes the image signal to be suitable for an operating condition of the display unit 100 and the data driver 115. The signal controller 140 may generate the image data signal to be provided to the data driver 115. The signal controller 140 may be mounted by the chip-on-board (COB) type on the second circuit board 130.

The image signal generator 150 may be electrically connected to the second circuit board 130 through the third connecting member 155. The image signal generator 150 generates the image signal and the input control signal to be provided to the signal controller 140. The third connecting member 155 may include the flexible printed circuit, the FFC, etc.

The assembly in which the second circuit board 130, the second connecting member 135, and the connection member 120 are assembled may be referred to as a second printed board assembly.

The signal controller 140 may include a master 141 and a slave 142.

The master 141 is connected to a transmitting line TXL, and applies a transmitting signal (referring to TXS of FIG. 3), which is for the contact diagnosis or the connection diagnosis, to the transmitting line TXL. The transmitting line TXL may extend from the master 141 to the second connecting member 135, and may be connected to the connection member 120 through the second connecting member 135. That is, the second connecting member 135 may include the transmitting line TXL connected to the master 141. As shown in FIG. 1, a transmitting line TXL may be included in each of two second connecting members 135. The transmitting line TXL may be at least one among the plurality of wires included in the second connecting member 135.

The slave 142 is connected to the receiving line RXL, and receives a receiving signal (referring to RXS of Table 1)

through the receiving line RXL. The receiving line RXL may extend from the slave 142 to the second connecting member 135, and may be connected to the connection member 120 through the second connecting member 135. That is, the second connecting member 135 may include the receiving line RXL connected to the slave 142. As shown in FIG. 1, a receiving line RXL may be included in each of two second connecting members 135. The receiving line RXL may be at least one among the plurality of wires included in the second connecting member 135, and may be different from the transmitting line TXL.

The first connecting member 117 may include an inspecting line DTL. The inspecting line DTL may include one terminal and another terminal located at the other terminal of the first connecting member 117. When the first connecting member 117 is connected to the connection member 120 at a correct position, one terminal of the inspecting line DTL may be in contact with the transmitting line TXL through the connection member 120, and the other terminal of the inspecting line DTL may be in contact with the receiving line RXL through the connection member 120. The inspecting line DTL in contact with the transmitting line TXL extends along the first connecting member 117, is then returned from the first circuit board 110, and may again extend along the first connecting member 117 to be in contact with the receiving line RXL. The inspecting line DTL may electrically connect the transmitting line TXL and the receiving line RXL to each other.

The panel unit PN and the input unit INP are connected to each other through the connection member 120, and in this case, the master 141 and the slave 142 may diagnose whether a connection state between the panel unit PN and the input unit INP through the connection member 120 is normal. In other words, the master 141 and the slave 142 may perform a connection diagnosis between the first printed board assembly and the second printed board assembly. This will be described later in FIG. 6.

On the other hand, in the manufacturing process of the display device, the inspecting unit DT, which is capable of driving the panel unit PN to inspect the panel unit PN, is connected to the panel unit PN. The inspecting unit DT may have substantially the same structure as the input unit INP of the display device. That is, the inspecting unit DT may include a connection member 120, a second circuit board 130, a second connecting member 135, a signal controller 140, an image signal generator 150, and a third connecting member 155. The inspecting unit DT is connected to the panel unit PN by the same method as the method through which the input unit INP is connected to the panel unit PN. That is, the panel unit PN and the inspecting unit DT may be connected to each other through the connection member 120.

The master 141 included in the inspecting unit DT applies the transmitting signal TXS to the transmitting line TXL, and the slave 142 included in the inspecting unit DT receives the receiving signal RXS through the receiving line RXL, thereby enabling diagnosis of whether the contact between the panel unit PN and the inspecting unit DT is normal. This is described later in FIG. 2 to FIG. 5.

Next, a method of performing the inspecting of the panel unit PN in the manufacturing process of the display device will be described with reference to FIG. 2 to FIG. 5.

Figure 2:
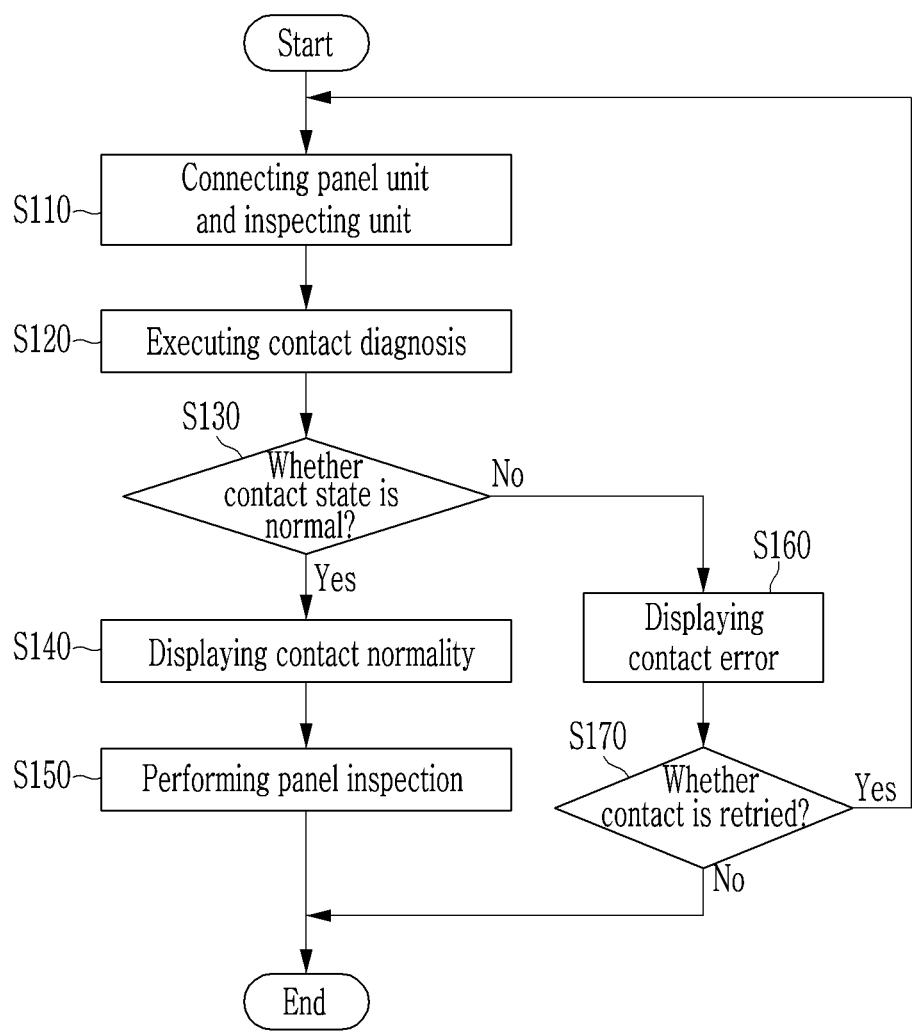
FIG. 2 is a flowchart showing an inspecting method of a display device according to an embodiment of the present invention.
Figure 3:
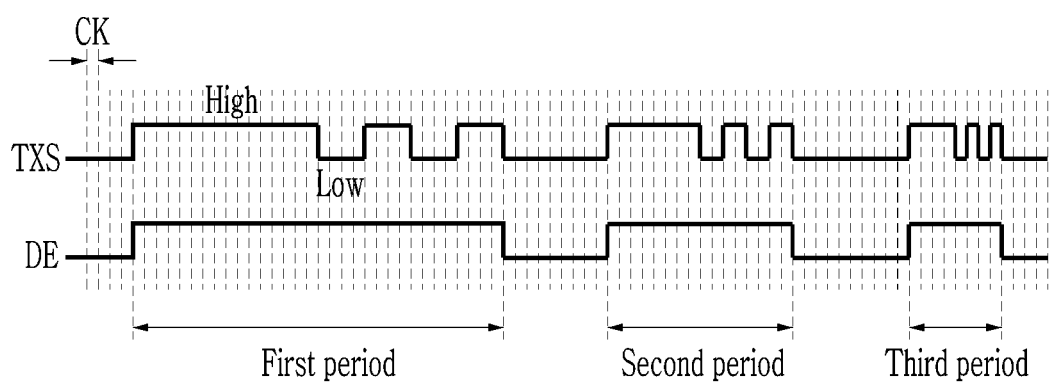
FIG. 3 is a waveform diagram to explain a method of performing contact diagnosis between a panel unit and an inspecting unit or a connection diagnosis between a panel unit and a driver according to an embodiment of the present invention.
Figure 4:
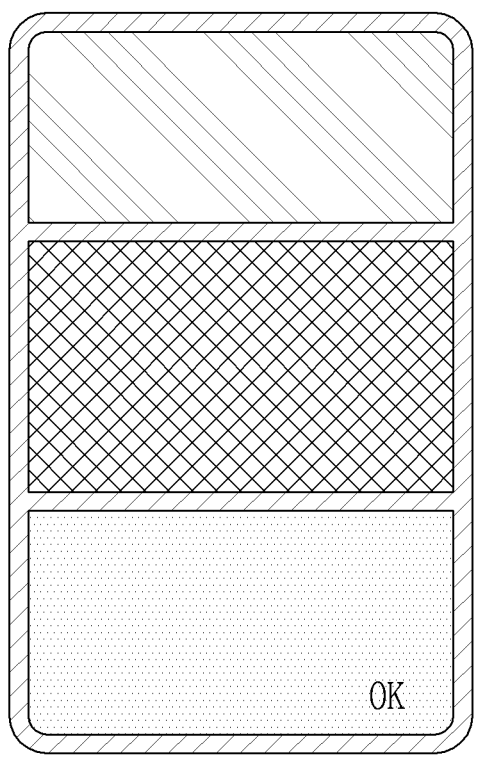
FIG. 4 is a view showing one example of a normal contact by contact diagnosis between a panel unit and an inspecting unit.
Figure 5:
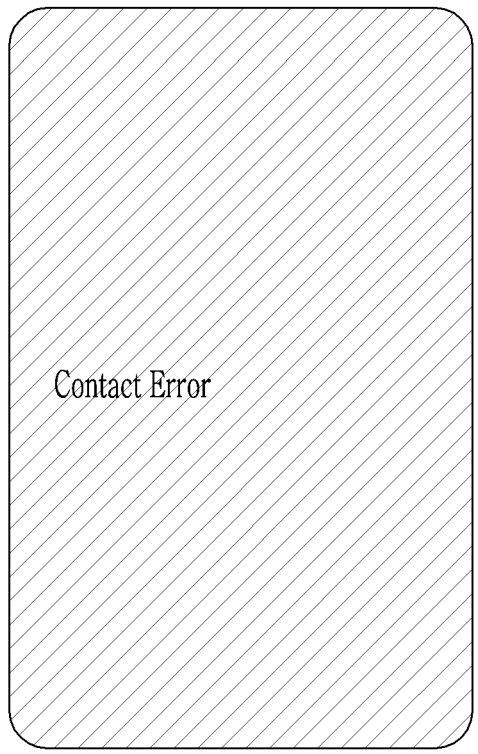
FIG. 5 is a view showing one example of a contact error by contact diagnosis between a panel unit and an inspecting unit.

FIG. 2 is a flowchart showing an inspecting method of a display device according to an embodiment of the present invention. FIG. 3 is a waveform diagram to explain a method of performing contact diagnosis between a panel unit and an inspecting unit or a connection diagnosis between a panel unit and a diver according to an embodiment of the present invention. FIG. 4 is a view showing one example of normal contact by contact diagnosis between a panel unit and an inspecting unit. FIG. 5 is a view showing one example of a contact error by contact diagnosis between a panel unit and an inspecting unit.

Referring to FIG. 2, the panel unit PN and the inspecting unit DT are connected (S110). The position of the panel unit PN is aligned so that the first connecting member 117 of the panel unit PN may contact with the connection member 120 of the inspecting unit DT, and then the first connecting member 117 may be in contact with the connection member 120. The method of aligning the position of the panel unit PN may be performed with the naked eye, according to the manufacturing equipment of the display device, or may be performed by an automatic alignment or manual alignment method using a marker.

If the panel unit PN and the inspecting unit DT are connected, the contact diagnosis for diagnosing whether the first connecting member 117 of the panel unit PN is in normal contact with the connection member 120 is performed (S120). The contact diagnosis may be performed by the signal controller 140 including the master 141 and the slave 142. The master 141 applies the transmitting signal TXS to the transmitting line TXL, the slave 142 receives the receiving signal RXS through the receiving line RXL, and the contact diagnosis, which is for determining whether the transmitting signal TXS transmitted by the master 141 and the receiving signal RXS received by the slave 142 are equal, may be performed. This is described with reference to FIG. 3.

Referring to FIG. 3, if the panel unit PN and the inspecting unit DT are connected, the enable signal DE for the contact diagnosis is applied to the master 141 and the slave 142. The master 141 outputs the transmitting signal TXS of a predetermined waveform during first to third periods in which the enable signal DE is applied with a high level, and the slave 142 confirms whether the receiving signal RXS received during the first to third periods is the same as the predetermined waveform.

A separation period in which the enable signal DE is applied with a low level may be located between the first period and the second period and between the second period and the third period. That is, the contact diagnosis between the panel unit PN and the inspecting unit DT, or the connection diagnosis between the panel unit PN and the input unit INP, may be divided into a plurality of periods and performed. The master 141 may divide the transmitting signal TXS into the plurality of periods to be transmitted, and the slave 142 may divide the receiving signal RXS into the plurality of periods to be received.

Lengths of the first to third periods may be different from each other. Also, the waveforms of the transmitting signal TXS output during the first to third periods may be different from each other. For example, when the length of the first period is longest and the length of the third period is shortest, the transmitting signal TXS of the waveform of which an on-time duty and an off-time duty are longest may be output during the first period, and the transmitting signal TXS of the waveform of which the on-time duty and the off-time duty are shortest may be output during the third period. The on-time duty may be the period in which the transmitting signal TXS is applied with the high level, and the off-time duty may be the period in which the transmitting signal TXS is applied with the low level.

As shown in FIG. 3, the first period may correspond to 32 clock periods CK in which the enable signal DE is applied with the high level, the second period may correspond to 16 clock periods CK in which the enable signal DE is applied with the high level, and the third period may correspond to 8 clock periods CK in which the enable signal DE is applied with the high level, for example. The clock period CK may correspond to a cycle of the clock signal that is generated by the signal controller 140, or that is externally supplied. As above-described, the second period may correspond to half of the first period, and the third period may correspond to half of the second period.

During the first period, the transmitting signal TXS may be output with the waveform having the on-time duty of 16 clock periods CK, the off-time duty of 4 clock periods CK, the on-time duty of 4 clock periods CK, the off-time duty of 4 clock periods CK, and the on-time duty of 4 clock periods CK. During the second period, the transmitting signal TXS may be output with the waveform having the on-time duty of 8 clock periods CK, the off-time duty of 2 clock periods CK, the on-time duty of 2 clock periods CK, the off-time duty of 2 clock periods CK, and the on-time duty of 2 clock periods CK. During the third period, the transmitting signal TXS may be output with the waveform having the on-time duty of 4 clock periods CK, the off-time duty of 1 clock period CK, the on-time duty of 1 clock period CK, the off-time duty of 1 clock period CK, and the on-time duty of 1 clock period CK. As described above, the waveform of the transmitting signal TXS applied during the second period may be the waveform having the cycle that is half the length of the transmitting signal TXS applied during the first period, and the waveform of the transmitting signal TXS applied during the third period may be the waveform having the cycle that is half the length of the transmitting signal TXS applied during the second period.

As described above, by differentiating the waveforms of the transmitting signal TXS output during the first to third periods from each other, the contact diagnosis between the panel unit PN and the inspecting unit DT may be further correctly performed. This is described with reference to Table 1.

Table 1 shows one example of the transmitting signal TXS output by the master 141 and the receiving signal RXS received by the slave 142.

TABLE 1

| | TXS | | RXS | | Diagnosis |
|---|---|---|---|---|---|
| | On time | Off time | On time | Off time | result |
| First period | 24 CK | 8 CK | 24 CK | 8 CK | Normal |
| Second period | 12 CK | 4 CK | 12 CK | 4 CK | Normal |
| Third period | 6 CK | 2 CK | 4 CK | 1 CK | Error |

The slave 142 counts the on-time duty and the off-time duty of the receiving signal RXS received during the first to third periods. That is, the slave 142 may determine to what degree the clock period CK corresponds to the on-time duty and the off-time duty of the receiving signal RXS. The slave 142 may confirm whether a counting result is the same as the on-time duty and the off-time duty of the transmitting signal TXS transmitted during the first to third periods by the master 141, and may determine whether the first connecting member 117 of the panel unit PN is in normal contact with the connection member 120. When it is determined that even one of the diagnosis results of the first to third period shows an error, the slave 142 may determine that the contact between the panel unit PN and the inspecting unit DT is defective.

When the first connecting member 117 of the panel unit PN is not in contact with the connection member 120 at the correct position such that the inspecting line DTL is not connected to the transmitting line TXL or the receiving line RXL, the receiving signal RXS of the first period does not match the transmitting signal TXS such that the contact error may be determined.

However, when the first connecting member 117 of the panel unit PN is connected to the connection member 120 at a position that is slightly deviated from the correct position, as shown in Table 1, the contact state may be determined as normal in the first period and the second period. However, in the third period in which the transmitting signal TXS of the short on-time duty and off-time duty is output, the receiving signal RXS is received differently from the transmitting signal TXS due to a resistance increase of the part where the inspecting line DTL is in contact with the transmitting line TXL or with the receiving line RXL such that the contact state may be determined as an error. That is, the contact error may be detected between the first connecting member 117 and the connection member 120 of the panel unit PN.

Again referring to FIG. 2, it is determined whether the contact state is normal between the panel unit PN and the inspecting unit DT according to the executing result of the contact diagnosis (S130).

When the contact state between the panel unit PN and the inspecting unit DT is normal, an image indicating contact normality may be displayed on the display unit 100 (S140). For example, the image indicating the contact normality may be a predetermined image, as shown in FIG. 4. A kind of the image indicating the contact normality is not limited.

Panel inspecting is performed when the contact state between the panel unit PN and the inspecting unit DT is normal (S150). The image for enabling the panel inspecting is displayed on the display unit 100, and it may be confirmed whether the panel unit PN is normally driven by picturing the image by a camera, and by inspecting the image (e.g., by the naked eye).

When the contact state between the panel unit PN and the inspecting unit DT has failed, an image indicating a contact error may be displayed on the display unit 100 (S160). In this case, a code instructing of a type of the contact error may be generated to be recorded to the memory provided in the inspecting unit DT. The image indicating the contact error may be, for example, a predetermined image as shown in FIG. 5. A kind of the image indicating the contact error is not particularly limited.

When the contact state between the panel unit PN and the inspecting unit DT is defective, it is determined whether to retry the contact of the panel unit PN and the inspecting unit (S170). When the contact of the panel unit PN and the inspecting unit is retried, the operation (S110) of connecting the panel unit PN and the inspecting unit DT and the following operations may be executed again. When the contact of the panel unit PN and the inspecting unit DT is not retried, the panel inspecting process is finished.

As described above, by executing the contact diagnosis between the panel unit PN and the inspecting unit DT in the panel inspecting process of confirming whether the driving of the panel unit PN is normal, any contact error between the panel unit PN and the inspecting unit DT is distinguished from any intrinsic failure of the panel unit PN. Also, it may be possible to avoiding determining that the panel unit PN of a good product is a defective product due to the contact error between the panel unit PN and the inspecting unit DT.

Next, the method of executing the connection diagnosis between the panel unit PN and the input unit INP in the display device of the manufacturing method is completed as described with reference to FIG. 6.

Figure 6:
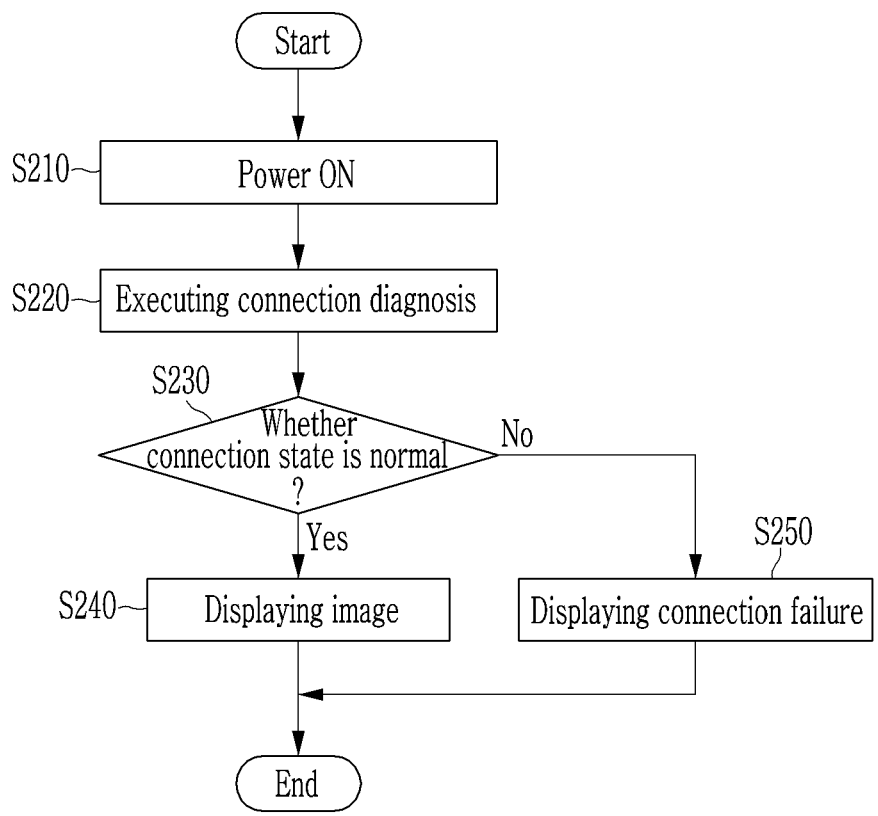
FIG. 6 is a flowchart showing an inspecting method of a display device according to another embodiment of the present invention.

FIG. 6 is a flowchart showing an inspecting method of a display device according to another embodiment of the present invention.

Referring to FIG. 6, power to the display device is turned on (S210), and the input unit INP executes the connection diagnosis between the panel unit PN and the input unit INP (S220). The method of executing the connection diagnosis may be the same as the method of executing the contact diagnosis described with reference to FIG. 2 and FIG. 3. However, there may be a difference in that the master 141 and the slave 142 included in the input unit INP execute the connection diagnosis, and the characteristics described above in FIG. 2 and FIG. 3 may be applied to FIG. 6 such that overlapping description is omitted.

It is determined whether the connection state between the panel unit PN and the input unit INP is normal according to the executing result of the connection diagnosis (S230).

When the connection state between the panel unit PN and the input unit INP is normal, the display device displays the image and is normally driven (S240).

When the connection state between the panel unit PN and the input unit INP is defective, an image indicating a connection failure may be displayed on the display unit 100 (S250). The image indicating the connection failure may be, for example, the predetermined image as shown in FIG. 5. The kind of the image indicating whether the connection failure occurs is not limited.

As described above, the connection failure between the panel unit PN and the input unit INP of the produced display device may be self-diagnosed, thereby easily confirming whether the display device is faulty or not.

Next, display devices according to another embodiment of the present invention are described with reference to FIG. 7 to FIG. 12. Differences are mainly described compared with FIG. 1, and overlapping description is omitted.

Figure 7:
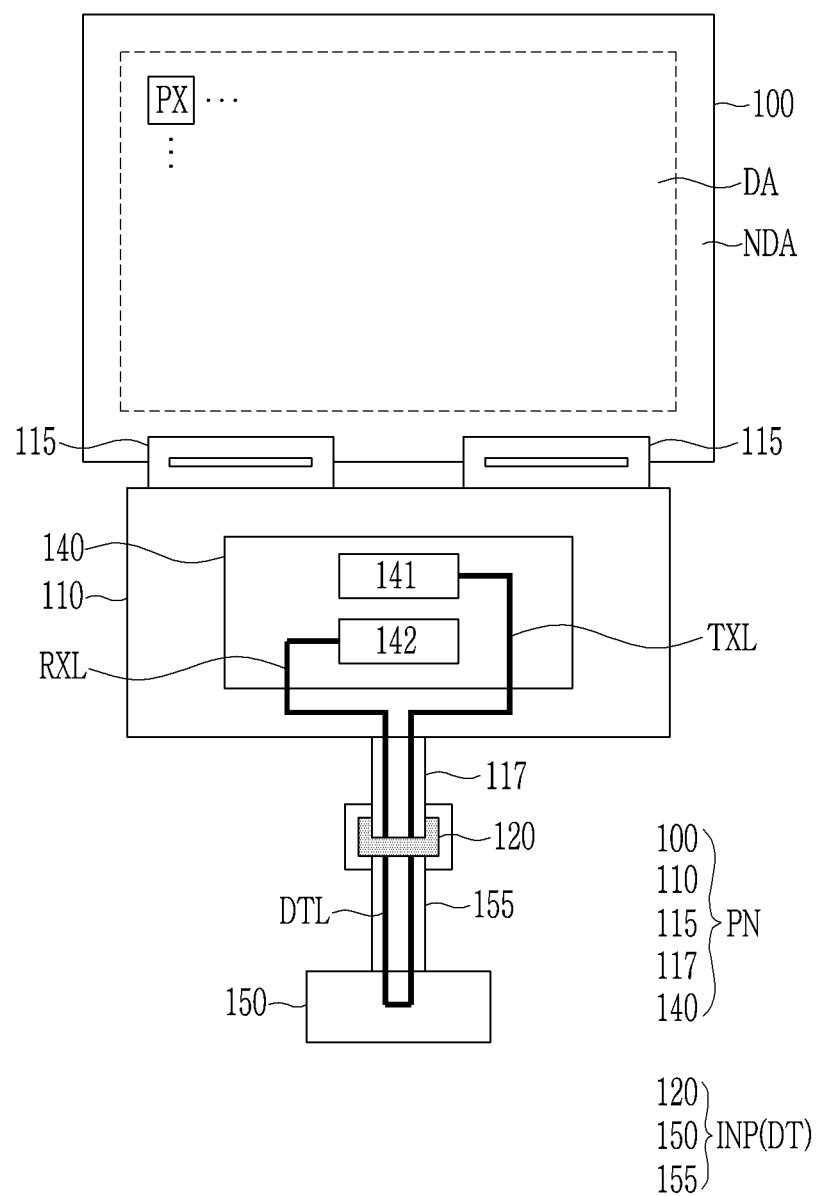
FIG. 7 is a block diagram showing a display device according to another embodiment of the present invention.

FIG. 7 is a block diagram showing a display device according to another embodiment of the present invention.

Referring to FIG. 7, the signal controller 140 is located at the first circuit board 110, and the second circuit board 130 of FIG. 1 is omitted. The signal controller 140 may be mounted on the first circuit board 110 as the chip-on-board (COB) type. That is, the panel unit PN may include the display unit 100, the first circuit board 110, the data driver 115, the first connecting member 117, and the signal controller 140.

The connection member 120 is connected to the third connecting member 155 connected to the image signal generator 150. That is, the input unit INP may include the connection member 120, the image signal generator 150, and the third connecting member 155. The inspecting unit DT may also include the connection member 120, the image signal generator 150, and the third connecting member 155.

The signal controller 140 includes the master 141 and the slave 142, and the transmitting line TXL connected to the master 141 extends from the master 141 to the first connecting member 117. One terminal of the transmitting line TXL is connected to the master 141, and the other terminal thereof may be located at the other terminal of the first connecting member 117. The receiving line RXL connected to the slave 142 extends from the slave 142 to the first connecting member 117. One terminal of the receiving line RXL is connected to the slave 142, and the other terminal thereof may be located at the other terminal of the first connecting member 117.

One terminal of the third connecting member 155 is connected to the image signal generator 150, and the other terminal thereof is connected to the connection member 120. The third connecting member 155 may include the inspecting line DTL. The one terminal and the other terminal of the inspecting line DTL are connected to the connection member 120, and when the first connecting member 117 is connected to the connection member 120 at the correct position, one terminal of the inspecting line DTL may be in contact with the transmitting line TXL through the connection member 120, while the other terminal of the inspecting line DTL may be in contact with the receiving line RXL through the connection member 120. The inspecting line DTL in contact with the transmitting line TXL extends along the third connecting member 155 and then is returned at the image signal generator 150, and may extend along the third connecting member 155 to be in contact with the receiving line RXL.

Except for the above described difference, the characteristics of the embodiment described with reference to FIG. 1 to FIG. 6 may be applied to the embodiment described with reference to FIG. 7 such that the overlapped descriptions between the embodiments are omitted.

Figure 8:
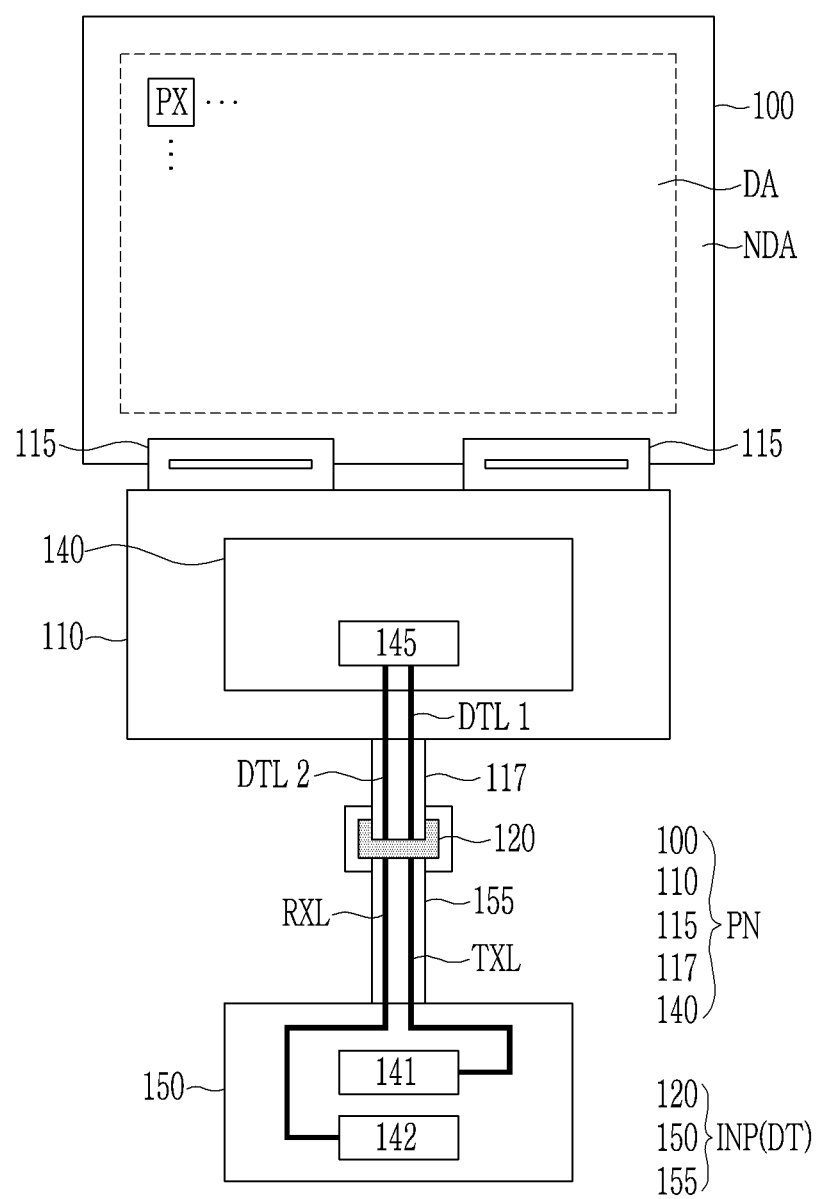
FIG. 8 is a block diagram showing a display device according to another embodiment of the present invention.
Figure 9:
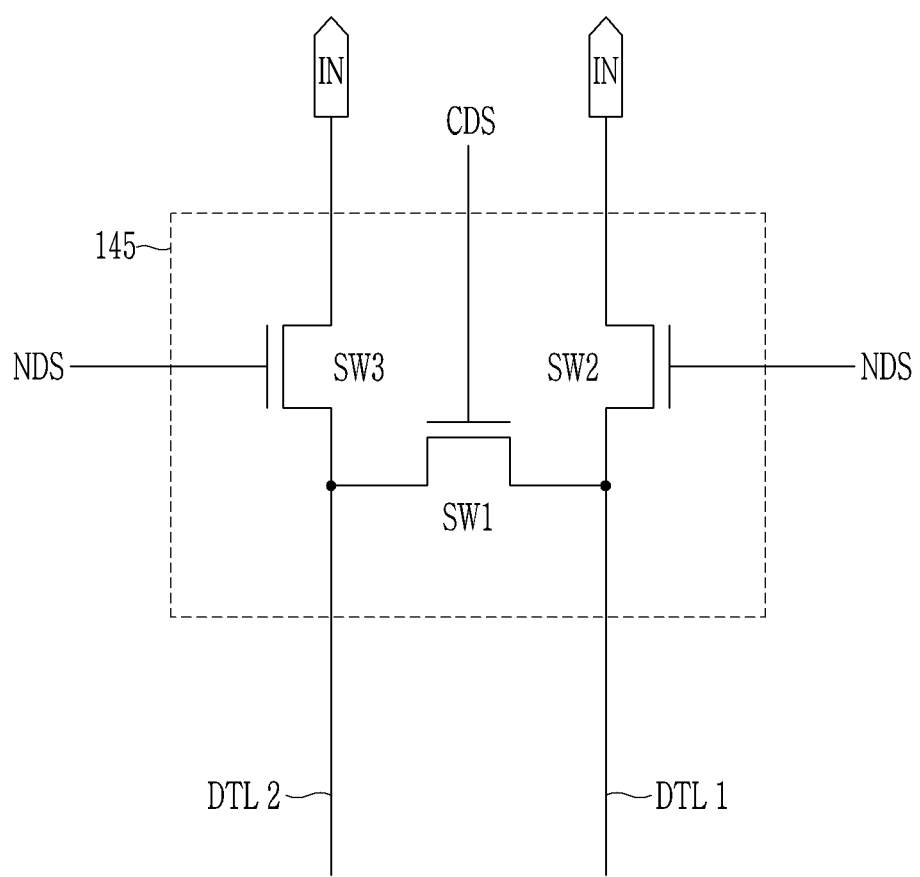
FIG. 9 is a view showing one example of a switching unit of the display device of FIG. 8.
Figure 10:
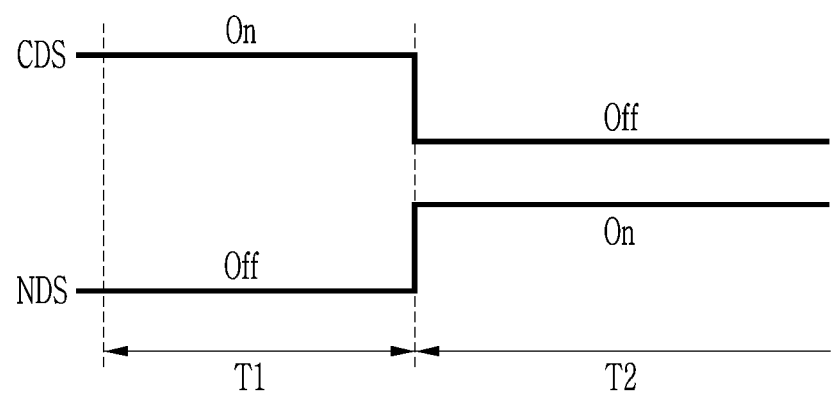
FIG. 10 is a waveform diagram to explain an operation of the switching unit of FIG. 9.

FIG. 8 is a block diagram showing a display device according to another embodiment of the present invention. FIG. 9 is a view showing one example of a switching unit of the display device of FIG. 8. FIG. 10 is a waveform diagram to explain an operation of the switching unit of FIG. 9.

Referring to FIG. 8 to FIG. 10, the signal controller 140 is located at the first circuit board 110, and the second circuit board 130 and the second connecting member 135 of FIG. 1 are omitted. The signal controller 140 may be mounted on the first circuit board 110 as the chip-on-board (COB) type. The panel unit PN may include the display unit 100, the first circuit board 110, the data driver 115, the first connecting member 117, and the signal controller 140.

The connection member 120 is connected to the third connecting member 155 connected to the image signal generator 150. The input unit INP may include the connection member 120, the image signal generator 150, and the third connecting member 155. Also, the inspecting unit DT may include the connection member 120, the image signal generator 150, and the third connecting member 155.

The image signal generator 150 includes the master 141 and the slave 142. The transmitting line TXL connected to the master 141 extends from the master 141 to the third connecting member 155. One terminal of the transmitting line TXL may be connected to the master 141, and the other terminal thereof may be connected to the connection member 120. The receiving line RXL connected to the slave 142 extends from the slave 142 to the third connecting member 155. One terminal of the receiving line RXL may be connected to the slave 142 and the other terminal thereof may be connected to the connection member 120.

The signal controller 140 may include a switching unit 145. The first inspecting line DTL1 may include one terminal located at the other terminal of the first connecting member 117, and the other terminal connected to the switching unit 145. The second inspecting line DTL2 may include one terminal located at the other terminal of the first connecting member 117, and the other terminal connected to the switching unit 145. When the first connecting member 117 is connected to the connection member 120 at the correct position, one terminal of the first inspecting line DTL1 may be in contact with the transmitting line TXL through the connection member 120, and one terminal of the second inspecting line DTL2 may be in contact with the receiving line RXL through the connection member 120. The first inspecting line DTL1 and the second inspecting line DTL2 may extend along the first connecting member 117, and may be connected to each other through the switching unit 145.

When executing the connection diagnosis between the panel unit PN and the input unit INP, or when executing the contact diagnosis between the panel unit PN and the inspecting unit DT, the switching unit 145 may connect the first inspecting line DTL1 and the second inspecting line DTL2 to each other. Also, after executing the connection diagnosis between the panel unit PN and the input unit INP or the contact diagnosis between the panel unit PN and the inspecting unit DT, the switching unit 145 may separate the first inspecting line DTL1 and the second inspecting line DTL2 from each other during normal driving in which the image is displayed on the display unit 100. The operation of the switching unit 145 may be controlled by the signal controller 140.

As shown in FIG. 9, the switching unit 145 may include the first switch SW1, the second switch SW2, and the third switch SW3.

The first switch SW1 includes a gate electrode to which the contact test signal CDS is applied, a first electrode connected to the first inspecting line DTL1, and a second electrode connected to the second inspecting line DTL2. The first switch SW1 is turned on by the contact test signal CDS to electrically connect the first inspecting line DTL1 and the second inspecting line DTL2.

The second switch SW2 includes a gate electrode to which the normal driving signal NDS is applied, a first electrode connected to the first inspecting line DTL1, and a second electrode connected to the input terminal IN. The input terminal IN connected to the second switch SW2 may be one among the plurality of input terminals to which the image signal and the input control signal transmitted to the signal controller 140 from the image signal generator 150 are input.

The third switch SW3 includes a gate electrode to which the normal driving signal NDS is applied, a first electrode connected to the second inspecting line DTL2, and a second electrode connected to the input terminal IN. The input terminal IN connected to the third switch SW3 may be another among the plurality of input terminals to which the image signal and the input control signal transmitted from the image signal generator 150 to the signal controller 140 are input.

The first switch SW1, the second switch SW2, and the third switch SW3 may be n-channel electric field effect transistors. A gate-on voltage turning on the n-channel electric field effect transistor is a high level voltage, and a gate-off voltage turning it off is a low level voltage. Differently from FIG. 9, at least one among the first switch SW1, the second switch SW2, and the third switch SW3 may be a p-channel electric field effect transistor. The gate-on voltage turning on the p-channel electric field effect transistor is the low level voltage, and the gate-off voltage turning it off is the high level voltage.

As shown in FIG. 10, during a contact diagnosis period (or a connection diagnosis period) T1 in which the connection diagnosis between the panel unit PN and the input unit INP, or the contact diagnosis between the panel unit PN and the inspecting unit DT, is executed, the contact test signal CDS is output with the gate-on voltage, and the normal driving signal NDS is output with the gate-off voltage. Accordingly, the first switch SW1 is turned on such that the first inspecting line DTL1 and the second inspecting line DTL2 are electrically connected. As the first inspecting line DTL1 and the second inspecting line DTL2 are electrically connected, the transmitting signal TXS applied from the master 141 may be received by the slave 142 as the receiving signal RXS through the transmitting line TXL, the connection member 120, the first inspecting line DTL1, first switch SW1, the second inspecting line DTL2, the connection member 120, and the receiving line RXL. In this case, the second switch SW2 and the third switch SW3 are in the turned-off state, and the second switch SW2 and the third switch SW3 may prevent the transmitting signal TXS from being transmitted to the signal controller 140 as the image signal or the input control signal.

After the period T1 executing the connection diagnosis or the contact diagnosis, the contact test signal CDS is output with the gate-off voltage in the normal driving period T2, and the normal driving signal NDS is output with the gate-on voltage. Accordingly, the first switch SW1 is turned off, and the second switch SW2 and the third switch SW3 are turned on. The image signal generator 150 may transmit the image signal or the input control signal to the signal controller 140 through the second switch SW2 and the third switch SW3.

Except for the difference described above, the characteristics of the embodiment described with reference to FIG. 1 to FIG. 6 may be applied to the embodiment described with reference to FIG. 8 to FIG. 10, and overlapping descriptions between the embodiments are omitted.

Figure 11:
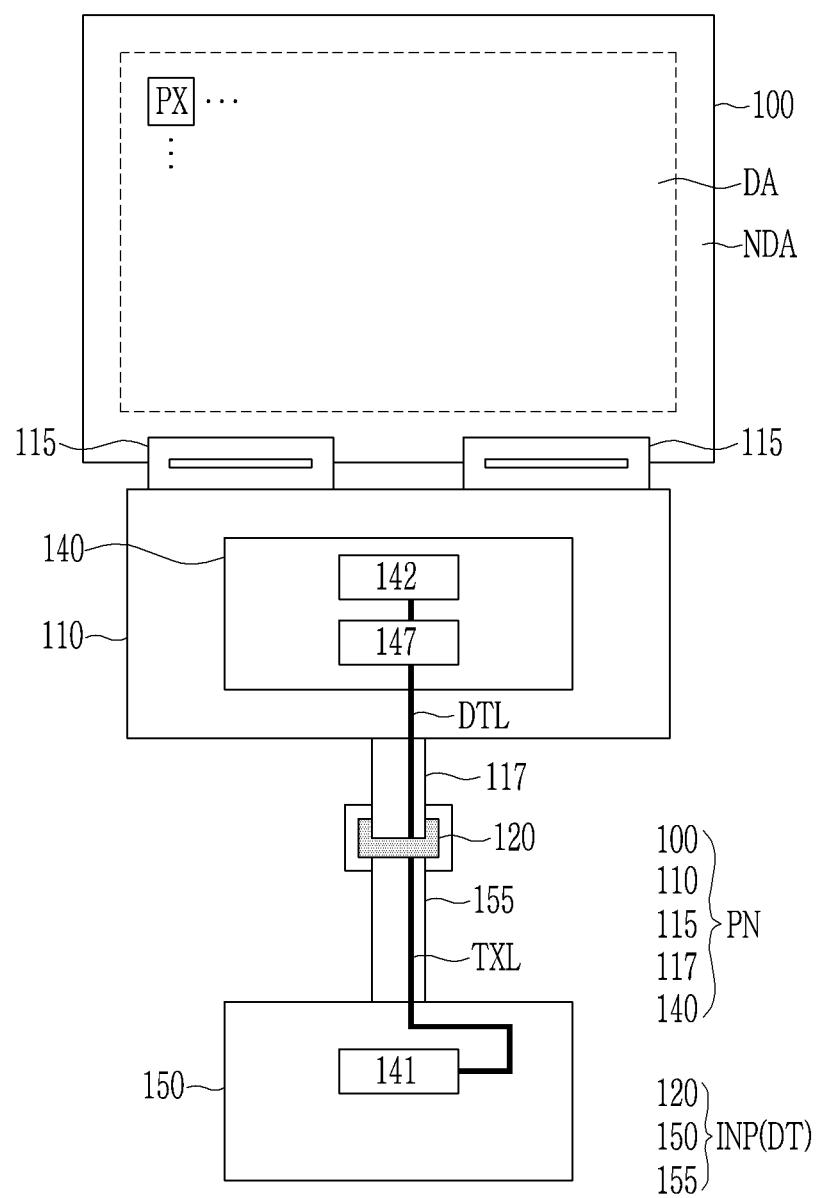
FIG. 11 is a block diagram showing a display device according to another embodiment of the present invention.
Figure 12:
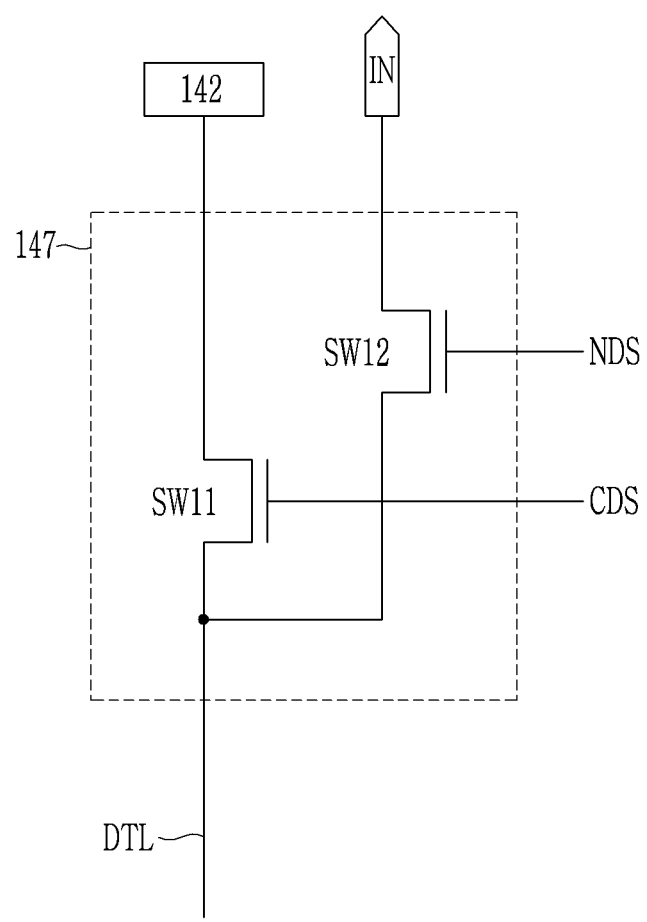
FIG. 12 is a view showing one example of a switching unit of the display device of FIG. 11.

FIG. 11 is a block diagram showing a display device according to another embodiment of the present invention. FIG. 12 is a view showing one example of a switching unit of the display device of FIG. 11.

Referring to FIG. 11 and FIG. 12, the signal controller 140 is located at the first circuit board 110, and the second circuit board 130 and the second connecting member 135 of FIG. 1 are omitted. The signal controller 140 may be mounted on the first circuit board 110 as the chip-on-board (COB) type. The panel unit PN may include the display unit 100, the first circuit board 110, the data driver 115, the first connecting member 117, and the signal controller 140.

The connection member 120 is connected to the third connecting member 155 connected to the image signal generator 150. That is, the input unit INP may include the connection member 120, the image signal generator 150, and the third connecting member 155. The inspecting unit DT may also include the connection member 120, the image signal generator 150, and the third connecting member 155.

The image signal generator 150 includes the master 141, and the signal controller 140 includes the slave 142. Also, the signal controller 140 further includes a switching unit 147. The transmitting line TXL connected to the master 141 extends from the master 141 to the third connecting member 155. One terminal of the transmitting line TXL may be connected to the master 141 and the other terminal thereof may be connected to the connection member 120. The inspecting line DTL may include one terminal located at the other terminal of the first connecting member 117, and may include another terminal connected to the switching unit 147. The inspecting line DTL may extend along the first connecting member 117, and may be connected to the slave 142 through the switching unit 147. When the first connecting member 117 is connected to the connection member 120 at the correct position, one terminal of the inspecting line DTL may be in contact with the transmitting line TXL through the connection member 120.

The switching unit 147 may connect the inspecting line DTL to the slave 142 when executing the connection diagnosis between the panel unit PN and the input unit INP or the contact diagnosis between the panel unit PN and the inspecting unit DT. After executing the connection diagnosis between the panel unit PN and the input unit INP or the contact diagnosis between the panel unit PN and the inspecting unit DT, the switching unit 147 may separate the inspecting line DTL from the slave 142 during the normal driving when displaying the image on the display unit 100. The operation of the switching unit 147 may be controlled by the signal controller 140.

As shown in FIG. 12, the switching unit 147 may include the first switch SW11 and the second switch SW12.

The first switch SW11 includes a gate electrode to which the contact test signal CDS is applied, a first electrode connected to the inspecting line DTL, and a second electrode connected to the slave 142. The first switch SW11 is turned on by the contact test signal CDS such that the inspecting line DTL and the slave 142 may be electrically connected.

The second switch SW12 includes a gate electrode to which the normal driving signal NDS is applied, a first electrode connected to the inspecting line DTL, and a second electrode connected to the input terminal IN. The input terminal IN connected to the second switch SW12 may be one among the plurality of terminals through which the image signal and the input control signal, which are transmitted from the image signal generator 150 to the signal controller 140, are input.

The first switch SW11 and the second switch SW12 may be n-channel electric field effect transistors. Differently from FIG. 12, at least one of the first switch SW11 and the second switch SW12 may be the p-channel electric field effect transistor.

The contact test signal CDS controlling the switching unit 147 and the normal driving signal NDS may be applied as shown in FIG. 10. The contact test signal CDS is output with the gate-on voltage and the normal driving signal NDS is output with the gate-off voltage during the period T1 for executing the connection diagnosis between the panel unit PN and the input unit INP or the contact diagnosis between the panel unit PN and the inspecting unit DT. Accordingly, the first switch SW11 is turned on such that the inspecting line DTL and the slave 142 are electrically connected. As the inspecting line DTL is connected to the slave 142, the transmitting signal TXS applied from the master 141 may be received by the slave 142 as the receiving signal RXS through the transmitting line TXL, the connection member 120, the inspecting line DTL, and the first switch SW11. In this case, the second switch SW12 is in the turned-off state, and the second switch SW12 may prevent the transmitting signal TXS from being transmitted to the signal controller 140 as the image signal or the input control signal.

After the period T1 for executing the connection diagnosis or the contact diagnosis, the contact test signal CDS is output with the gate-off voltage in the normal driving period T2, and the normal driving signal NDS is output with the gate-on voltage. Accordingly, the first switch SW11 is turned off, and the second switch SW12 is turned on. The image signal generator 150 may transmit the image signal or the input control signal to the signal controller 140 through the second switch SW12.

Except for the difference described above, the characteristics of the embodiment described with reference to FIG. 1 to FIG. 6 may be applied to the embodiment described with reference to FIG. 11 and FIG. 12, and overlapping descriptions between the embodiments are omitted.

Figure 13:
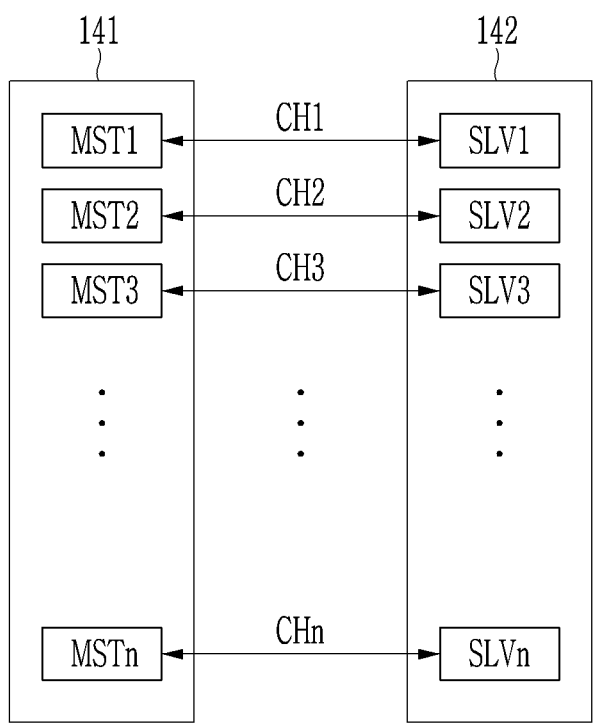
FIG. 13 is a view showing a channel between a master and a slave according to an embodiment of the present invention.

FIG. 13 is a view showing a channel between a master and a slave according to an embodiment of the present invention.

Referring to FIG. 13, the master 141 may include a plurality of master blocks MST1, MST2, MST3, ..., MSTn, and the slave 142 may include a plurality of slave blocks SLV1, SLV2, SLV3, ..., SLVn respectively corresponding to the master blocks MST1, MST2, MST3, ..., MSTn. The plurality of master blocks MST1, MST2, MST3, ..., MSTn and the plurality of slave blocks SLV1, SLV2, SLV3, ..., SLVn may be connected through a plurality of channels CH1, CH2, CH3, ..., CHn, respectively.

Each of the plurality of master blocks MST1, MST2, MST3, ..., MSTn may execute the same function as the master 141 described in FIG. 1, FIG. 7, FIG. 8, and FIG. 11. Also, each of the plurality of slave blocks SLV1, SLV2, SLV3, ..., SLVn may execute the same function as the slave 142 described in FIG. 1, FIG. 7, FIG. 8, and FIG. 11.

The plurality of channels CH1, CH2, CH3, ..., CHn are paths through which the plurality of master blocks MST1, MST2, MST3, ..., MSTn and the plurality of slave blocks SLV1, SLV2, SLV3, ..., SLVn are respectively connected. For example, each of the plurality of channels CH1, CH2, CH3, ..., CHn may correspond to the transmitting line TXL, the inspecting line DTL, and the receiving line RXL as the paths through which the master 141 and the slave 142 described in FIG. 1 and FIG. 7 are electrically connected. Also, each of the plurality of channels CH1, CH2, CH3, ..., CHn may correspond to the transmitting line TXL, the first inspecting line DTL1, the second inspecting line DTL2, and the receiving line RXL as the paths through which the master 141 and the slave 142 described in FIG. 8 are electrically connected. In addition, each of the plurality of channels CH1, CH2, CH3, ..., CHn may correspond to the transmitting line TXL and the inspecting line DTL as the paths through which the master 141 and the slave 142 described in FIG. 11 are electrically connected.

That is, the master 141 and the slave 142 described in FIG. 1, FIG. 7, FIG. 8, and FIG. 11 may be connected to each other through the plurality of channels CH1, CH2, CH3, ..., CHn, and the master 141 and the slave 142 may execute the contact diagnosis or the connection diagnosis for the plurality of channels CH1, CH2, CH3, ..., CHn.

Figure 14:
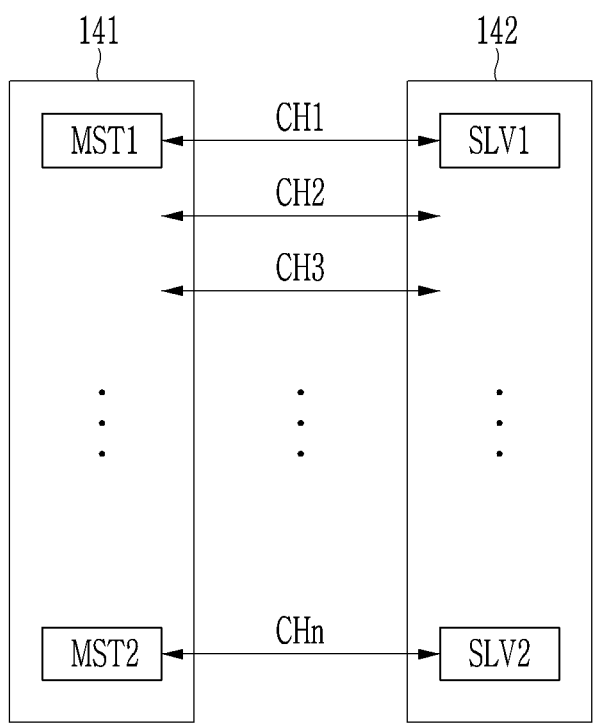
FIG. 14 is a view showing a channel between a master and a slave according to another embodiment of the present invention.

FIG. 14 is a view showing a channel between a master and a slave according to another embodiment of the present invention. Differences from the embodiment of FIG. 13 are mainly described, and overlapping description is omitted.

Referring to FIG. 14, the master 141 among the plurality of channels CH1, CH2, CH3, ..., CHn that may be formed between the master 141 and the slave 142 may include master blocks MST1 and MST2 corresponding to the specific channels CH1 and CHn, and the slave 142 may include slave blocks SLV1 and SLV2 corresponding to the specific channels CH1 and CHn. The specific channels CH1 and CHn may correspond to the wiring that is vulnerable to contact with the connection member 120 among the wiring included in the first connecting member 117 or the wiring that is advantageous for executing the contact diagnosis or the connection diagnosis. For example, the specific channels CH1 and CHn may correspond to the wiring located outermost among the wiring extending along the first connecting member 117.

The drawings referred to and the detailed description of the present invention disclosed up to now are just exemplary in the present invention, and they are used for describing the present invention and are not used to limit a meaning or limit the scope of the present invention disclosed in the claims. Accordingly, those skilled in the art to which the invention pertains can easily understand that various modifications and equivalent embodiments may be possible. Therefore, a substantial technical protective range of the present invention will be determined based on a technical idea of the appended claims.

What is claimed is:

1. A display device comprising:
a panel unit comprising a display unit comprising pixels for displaying an image, a first circuit board connected to the display unit, and a first connecting member connected to the first circuit board;
an input unit comprising a connection member configured to be attached to the first connecting member, and to provide an image signal to the panel unit;
a master configured to output a transmitting signal for diagnosing an electrical connection between the first connecting member and the connection member;
a transmitting line connected to the master;
an inspecting line configured to be connected to the transmitting line through the connection member; and
a slave configured to be connected to the master through the inspecting line, to receive the transmitting signal as a receiving signal, and to enable determination of an on-time duty and an off-time duty of the receiving signal to determine whether a connection error between the panel unit and the input unit exists.

2. The display device of claim 1, wherein the input unit further comprises:
a second connecting member connected to the connection member;
a second circuit board connected to the second connecting member; and
a signal controller at the second circuit board, and comprising the master and the slave.

3. The display device of claim 2, further comprising a receiving line connected to the slave, and extending along the second connecting member to be connected to the connection member,
wherein the transmitting line extends along the second connecting member to be connected to the connection member, and
wherein the inspecting line is at the first connecting member and comprises one terminal configured to be in contact with the transmitting line through the connection member, and another terminal configured to be in contact with the receiving line through the connection member.

4. The display device of claim 1, wherein the input unit further comprises a third connecting member connected to the connection member, and an image signal generator connected to the third connecting member, and
wherein the panel unit further comprises a signal controller comprising the master and the slave at the first circuit board.

5. The display device of claim 4, further comprising a receiving line connected to the slave, and extending along the first connecting member,
wherein the transmitting line extends along the first connecting member, and
wherein the inspecting line is at the third connecting member and comprises one terminal configured to contact the transmitting line through the connection member, and another terminal configured to contact the receiving line through the connection member.

6. The display device of claim 1, wherein the input unit further comprises a third connecting member connected to the connection member, and an image signal generator comprising the master and the slave and connected to the third connecting member, and
wherein the panel unit further comprises a signal controller at the first circuit board.

7. The display device of claim 6, further comprising a receiving line connected to the slave, and extending along the third connecting member to be connected to the connection member,
wherein the transmitting line extends along the third connecting member to be connected to the connection member, and
wherein the inspecting line comprises a first inspecting line configured to be in contact with the transmitting line through the connection member, and a second inspecting line configured to be in contact with the receiving line through the connection member.

8. The display device of claim 7, wherein the signal controller is connected to the first inspecting line and the second inspecting line, and comprises a switching unit for electrically connecting the first inspecting line and the second inspecting line.

9. The display device of claim 8, wherein the switching unit comprises:
a first switch for electrically connecting the first inspecting line and the second inspecting line;
a second switch for connecting the first inspecting line to an input terminal of the signal controller; and
a third switch for connecting the second inspecting line to the input terminal of the signal controller.

10. The display device of claim 9, wherein the first switch is configured to be turned on during a connection diagnosis period for executing a connection diagnosis between the panel unit and the input unit, and
wherein the second switch and the third switch are configured to be turned on during a normal driving period for displaying an image on the display unit.

11. The display device of claim 1, wherein the input unit further comprises:
a third connecting member connected to the connection member; and
an image signal generator comprising the master, and connected to the third connecting member, and
wherein the panel unit further comprises a signal controller comprising the slave at the first circuit board.

12. The display device of claim 11, wherein the signal controller further comprises a switching unit for electrically connecting the inspecting line to the slave, wherein the transmitting line extends along the third connecting member to be connected to the connection member, and
wherein the inspecting line extends along the first connecting member to be connected to the switching unit.

13. The display device of claim 12, wherein the switching unit comprises:
a first switch for electrically connecting the inspecting line and the slave; and
a second switch for connecting the inspecting line to an input terminal of the signal controller.

14. The display device of claim 13, wherein the first switch is configured to be turned on during a connection diagnosis period for executing a connection diagnosis between the panel unit and the input unit, and
wherein the second switch is configured to be turned on during a normal driving period for displaying an image on the display unit.

15. The display device of claim 1, wherein the master is configured to divide the transmitting signal into a plurality of periods, and to transmit the divided transmitting signal, which is output with a waveform of cycles that are different from each other for each of the plurality of periods.

16. An inspecting method of a display device, the method comprising:
- connecting a panel unit, which comprises a display unit comprising pixels for displaying an image, a first circuit board connected to the display unit, and a first connecting member connected to the first circuit board, and an inspecting unit, which comprises a connection member configured to be attached to the first connecting member;
- applying a transmitting signal for enabling contact diagnosis between the first connecting member and the connection member to a transmitting line;
- receiving the transmitting signal as a receiving signal through an inspecting line connected to the transmitting line through the connection member; and
- determining an on-time and an off-time duty of the receiving signal to determine a contact error between the panel unit and the inspecting unit.

17. The inspecting method of claim 16, wherein the applying of the transmitting signal to the transmitting line comprises:
- outputting a transmitting signal of a first waveform during a first period; and
- outputting a transmitting signal of a second waveform during a second period that is shorter than the first period.

18. The inspecting method of claim 17, wherein a cycle of the transmitting signal of the second waveform is shorter than a cycle of the transmitting signal of the first waveform.

19. The inspecting method of claim 16, further comprising displaying an image on the display unit indicating a contact normality when a contact between the panel unit and the inspecting unit is normal.

20. The inspecting method of claim 16, further comprising displaying an image on the display unit indicating a contact error when a contact between the panel unit and the inspecting unit is defective.

* * * * *